(12) United States Patent
Turpin et al.

(10) Patent No.: US 9,207,269 B2
(45) Date of Patent: Dec. 8, 2015

(54) AUTOMATICALLY DETECTING IN-BAND BUT OUT-OF-SPAN POWER IN A FREQUENCY-DOMAIN TEST AND MEASUREMENT INSTRUMENT

(75) Inventors: John F. Turpin, Tigard, OR (US); Alfred K. Hillman, Jr., Banks, OR (US)

(73) Assignee: Tektronix, Inc., Beaverton, OR (US)

( * ) Notice: Subject to any disclaimer, the term of this patent is extended or adjusted under 35 U.S.C. 154(b) by 667 days.

(21) Appl. No.: 13/477,360

(22) Filed: May 22, 2012

(65) Prior Publication Data

US 2013/0317769 A1 Nov. 28, 2013

(51) Int. Cl.
| | |
|---|---|
| G01R 21/133 | (2006.01) |
| G01R 13/02 | (2006.01) |
| G01R 23/18 | (2006.01) |
| G06F 15/00 | (2006.01) |
| G01R 23/20 | (2006.01) |

(52) U.S. Cl.
CPC ............ *G01R 21/133* (2013.01); *G01R 13/029* (2013.01); *G01R 23/18* (2013.01); *G06F 15/00* (2013.01); *G01R 23/20* (2013.01)

(58) Field of Classification Search
CPC .... G01R 21/133; G01R 23/18; G01R 13/029; G01R 23/20; G06F 15/00
See application file for complete search history.

(56) References Cited

U.S. PATENT DOCUMENTS

| | | | | |
|---|---|---|---|---|
| 5,075,618 | A * | 12/1991 | Katayama | 324/76.27 |
| 6,522,345 | B1 * | 2/2003 | Alexander | 715/771 |
| 6,681,191 | B1 * | 1/2004 | Pickerd et al. | 702/76 |
| 6,687,628 | B2 * | 2/2004 | Jaffe | 702/67 |
| 6,734,857 | B2 * | 5/2004 | Loughner, II | 345/440.1 |
| 6,768,293 | B2 * | 7/2004 | Snaddon et al. | 324/76.19 |
| 6,950,054 | B1 * | 9/2005 | Steinway et al. | 342/22 |
| 7,107,165 | B2 * | 9/2006 | Boyan et al. | 702/75 |
| 7,920,990 | B2 * | 4/2011 | Nicholls et al. | 702/190 |
| 2002/0120414 | A1 * | 8/2002 | Jaffe | 702/67 |
| 2003/0102856 | A1 * | 6/2003 | Snaddon et al. | 324/76.39 |
| 2004/0027360 | A1 * | 2/2004 | Loughner, II | 345/660 |
| 2005/0104906 | A1 * | 5/2005 | Boyan et al. | 345/690 |
| 2006/0044391 | A1 | 3/2006 | Mauger et al. | |
| 2007/0027675 | A1 * | 2/2007 | Hertz | 704/200.1 |
| 2009/0085555 | A1 | 4/2009 | Heerema et al. | |
| 2009/0091441 | A1 * | 4/2009 | Schweitzer et al. | 340/531 |
| 2010/0235131 | A1 * | 9/2010 | Engholm et al. | 702/108 |
| 2013/0082683 | A1 * | 4/2013 | Kang | 324/103 R |
| 2013/0158923 | A1 * | 6/2013 | Stanton et al. | 702/76 |

FOREIGN PATENT DOCUMENTS

| | | |
|---|---|---|
| EP | 0157135 A1 | 10/1985 |
| EP | 0439157 A2 | 7/1991 |
| WO | 2007076174 A2 | 7/2007 |
| WO | 2009012342 A2 | 1/2009 |
| WO | WO 2009012342 A2 * | 1/2009 ............ G01R 23/16 |

OTHER PUBLICATIONS

"R&S® FSW Signal and Spectrum Analyzer" web page, available at http://www2.rohde-schwarz.com/product/FSW.html , dated (copyrighted) 2012, accessed on May 22, 2012.
European Search Report for Application No. 13168092.8, Sep. 5, 2013, pp. 1-9, European Patent Office, Berlin, Germany.

* cited by examiner

*Primary Examiner* — John Breene
*Assistant Examiner* — Jeffrey Aiello
(74) *Attorney, Agent, or Firm* — Michael A. Nelson; Marger Johnson

(57) ABSTRACT

A test and measurement instrument according to an embodiment of the present invention automatically detects excessive in-band but out-of-span energy and notifies the user of the condition.

20 Claims, 2 Drawing Sheets

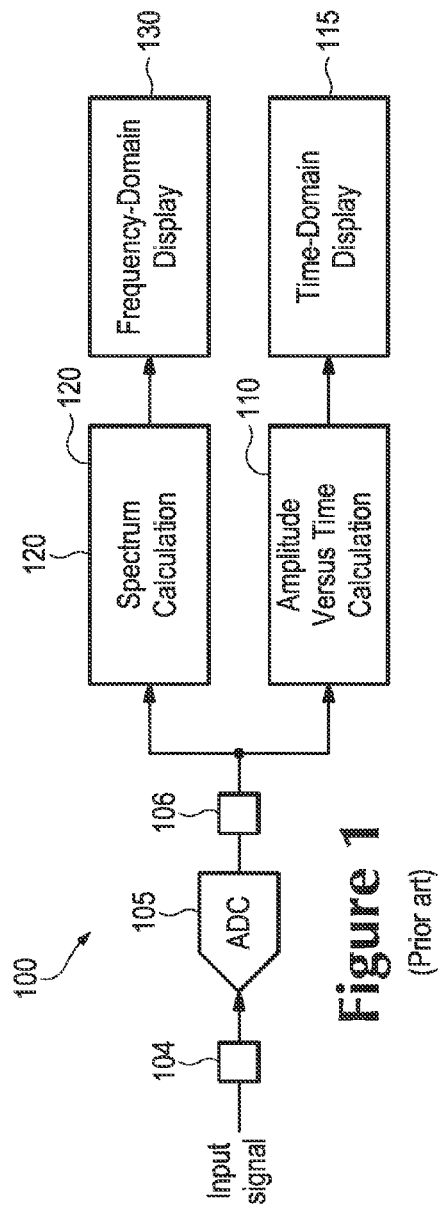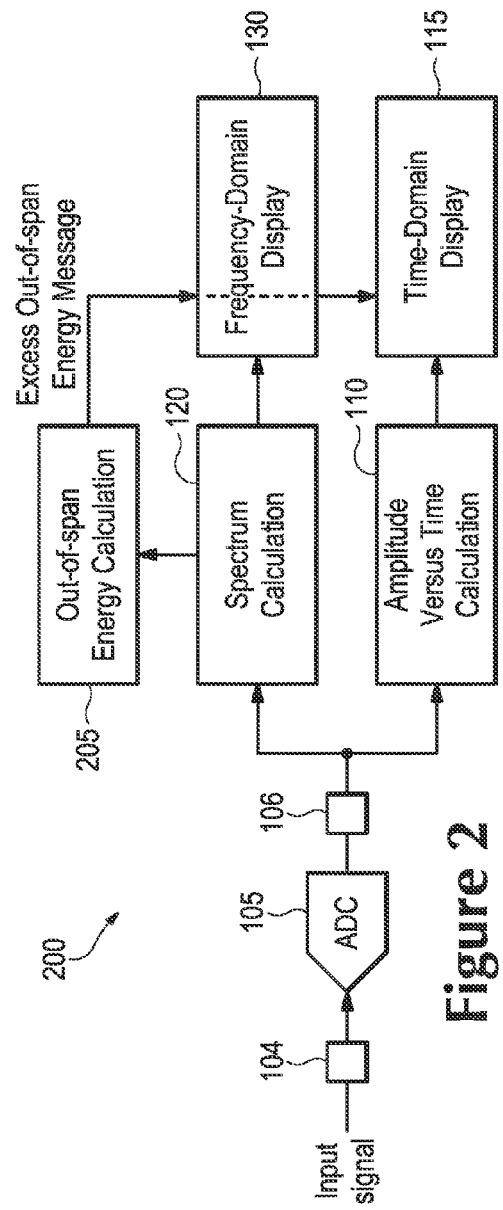

AUTOMATICALLY DETECTING IN-BAND BUT OUT-OF-SPAN POWER IN A FREQUENCY-DOMAIN TEST AND MEASUREMENT INSTRUMENT

FIELD OF THE INVENTION

The present invention relates to test and measurement instruments, and more particularly to test and measurement instruments which display frequency-domain information.

BACKGROUND OF THE INVENTION

Some test and measurement instruments, such as RSA6100 Series Real-Time Spectrum Analyzers and MDO4000 Series Mixed Domain Oscilloscopes, available from Tektronix, Inc. of Beaverton, Oreg., are capable of displaying both time-domain and frequency-domain views of an input signal.

When using such a test and measurement instrument, a user can sometimes encounter signals which are visible in the time-domain display but not in the frequency-domain display. This typically occurs because the time-domain display shows data from the entire acquisition bandwidth of the instrument, whereas the frequency-domain display only shows a subset of that data. That is because the frequency-domain display does not show the very ends of the acquisition bandwidth, which are distorted by attenuation and phase nonlinearity due to various analog and digital filters within the acquisition path of the instrument. As a result, a signal that is located within the acquisition bandwidth of the instrument but outside of the displayed span, i.e., a signal that is "in-band but out-of-span," or simply, "out-of-span," will be visible in the time-domain display but not in the frequency-domain display.

This discrepancy can result in a variety of confusing scenarios for a user.

One scenario is where time-domain and frequency-domain measurements simply do not agree. The user is left trying to figure out why these two supposedly equivalent measurements yield different results.

Another scenario is when excessive in-band but out-of-span power causes an overflow condition. A user looking in the frequency-domain display will not see the excessive power, and is left wondering why the instrument is showing an overflow condition.

Some spectrum analyzers such as the FSW Signal and Spectrum Analyzer available from Rohde & Schwarz of Munich, Germany allow the user to view an enlarged spectral display which shows the entire acquisition bandwidth of the instrument, including the band-edge roll-off. However, the problem with this implementation is that the user must be knowledgeable enough to know when to activate the enlarged spectral display. For users who are not experienced with spectrum analyzers, it can be very confusing to get either differing measurement results or unexplained warning messages. Without a significant amount of experience, the user may not know he or she should make the span setting larger to see the real problem.

SUMMARY OF THE INVENTION

A test and measurement instrument according to an embodiment of the present invention automatically detects excessive in-band but out-of-span energy and notifies the user of the condition.

The objects, advantages, and other novel features of the present invention are apparent from the following detailed description when read in conjunction with the appended claims and attached drawings.

BRIEF DESCRIPTION OF THE DRAWINGS

FIG. 1 depicts a simplified, high-level block diagram of a conventional test and measurement instrument.

FIG. 2 depicts a simplified, high-level block diagram of a test and measurement instrument according to an embodiment of the present invention.

DETAILED DESCRIPTION OF THE INVENTION

Figure 3:
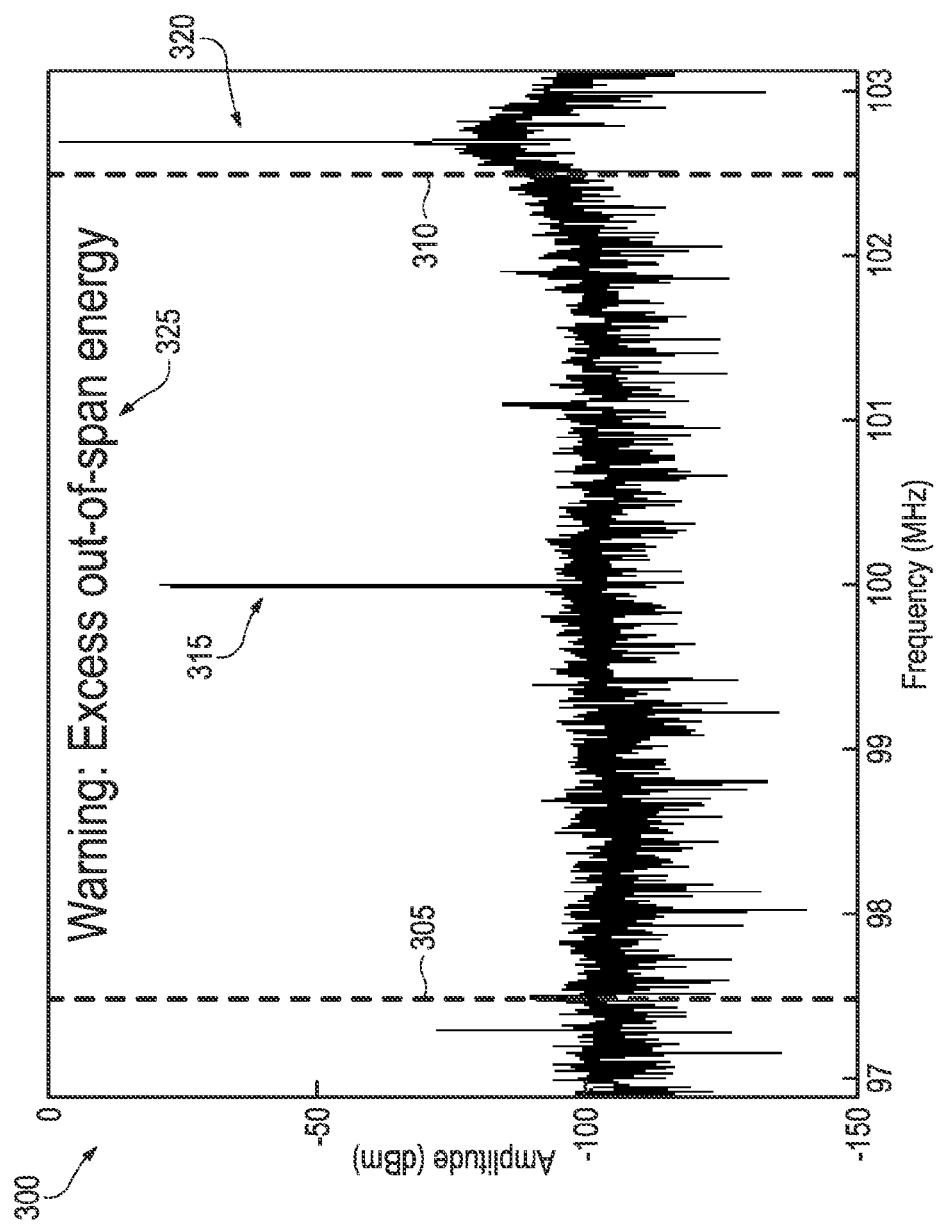
FIG. 3 depicts a frequency-domain display produced using the test and measurement instrument of FIG. 2.

FIG. 1 depicts a simplified, high-level block diagram of a conventional test and measurement instrument 100 such as a Real-Time Spectrum Analyzer, a Mixed Domain Oscilloscope, or the like. In its simplest form, an analog input signal is input to analog-to-digital converter 105 which digitizes it to produce digital data. Depending on the particular type of instrument, the analog input signal may be filtered by an analog filter 104 before it is digitized (e.g., by a down-converter), and/or it may be filtered by a digital filter 106 after it is digitized (e.g., for sample rate decimation). The digital data is then processed to provide two different displays. First, the digital data is processed to calculate a power or amplitude versus time trace 110, for example, by converting the digital data into in-phase (I) and quadrature (Q) samples and then calculating $\sqrt{I^2+Q^2}$, and then that trace is then displayed on a time-domain display 115. The digital data is also processed to calculate a frequency spectrum 120 using a frequency transform such as a fast Fourier transform (FFT), a chirp-Z transform, or the like. As discussed above, the filters 104 and 106 have roll-off that causes the ends of the frequency spectrum, for example, the upper and lower 10% of the bandwidth, to be distorted and thus unsuitable for use by the user. As such, the spectrum calculation 120 typically does not pass those parts of the frequency spectrum to the display. Given that the test and measurement instrument 100 may represent any one of various kinds of test and measurement instruments, instrument specific elements such as down-converters, trigger circuits, and the like are not shown for simplicity.

FIG. 2 depicts a simplified, high-level block diagram of a test and measurement instrument 200 according to an embodiment of the present. The test and measurement instrument 200 is similar to the test and measurement instrument 100 shown in FIG. 1, except that the calculated frequency spectrum is also passed to an out-of-span energy calculation 205 that monitors the input signal for excessive in-band but out-of-span energy. When excessive in-band but out-of-span energy is detected, the test and measurement instrument 200 notifies the user of the condition.

Excessive in-band but out-of-span energy may be detected in any one of various ways. For example, in various embodiments, it may be detected by determining whether the total out-of-span power exceeds any one of various quantities, such as an absolute power level, a percentage of the total in-span power, a percentage of the largest in-span signal, or a display value (e.g., the top-of-screen, reference level). These quantities may be defined by the user or defined by the instrument. Alternatively, excessive out-of-span power may be detected using analog circuitry, for example, by filtering the in-span power with a first analog filter, filtering the out-of-span power with a second filter, and then comparing the amplitudes of the resulting filtered signals.

The instrument may notify the user about the excessive in-band but out-of-span energy in various ways. For example, in some embodiments, the instrument displays a message on the time-domain display 115 or the frequency-domain display 130. In some embodiments, the instrument produces an audible tone. In some embodiments, the instrument directs the user to view the full span so that he or she can see the excessive out-of-span signal, or alternatively, automatically displays the full span for the user. In cases where the instrument is operated under remote control, the instrument may generate an interrupt. The instrument may also return any measurement results with an indication of an invalid measurement.

To aid in understanding, FIG. 3 depicts an exemplary frequency-domain display 300 produced using the test and measurement instrument 200 of FIG. 2. The full acquisition bandwidth is 97-103 MHz, or 6 MHz. However, the upper and lower 0.5 MHz of the spectrum are distorted as described above, so that during normal operation the upper and lower 0.5 MHz are not displayed, and thus the user only sees 97.5-102.5 MHz, or 5 MHz, as indicated by the dashed lines 305 and 310. Accordingly, during normal operation, a user looking at this display 300 would think (incorrectly) that the signal 315 at the center of the display is the primary signal within the acquisition bandwidth, however the in-band but out-of-span signal 320 is actually higher in power. The in-band but out-of-span signal 320 could cause any of the confusing scenarios discussed above, but fortunately, the test and measurement instrument 200 will automatically detect the in-band but out-of-span signal 320 as described above and then notify the user via a message 325, thereby avoiding any confusion. The test and measurement instrument 200 may also direct the user to display the full 6 MHz span so that the user may see the in-band but out-of-span signal 320.

It will be appreciated that, although the present invention is described in terms of test and measurement instruments that have both time-domain and frequency-domain displays, the present invention is also useful in test and measurement instruments that have only frequency-domain displays, for example, to detect when in-band but out-of-span signals result in overload conditions.

In various embodiments, elements shown and described above such as the spectrum calculation, the amplitude versus time calculation, the out-of-span energy calculation, and so on, may be implemented in hardware, software, or a combination of the two, and may comprise or be implemented on a general purpose microprocessor, a digital signal processor (DSP), an application specific integrated circuit (ASIC), a field-programmable gate array (FPGA), or the like.

It will be appreciated from the foregoing discussion that the present invention represents a significant advance in the field of test and measurement instruments. Although specific embodiments of the invention have been illustrated and described for purposes of illustration, it will be understood that various modifications may be made without departing from the spirit and scope of the invention. Accordingly, the invention should not be limited except as by the appended claims.

What is claimed is:

1. A test and measurement instrument comprising:
    an analog-to-digital converter configured to digitize an input signal to produce digital data;
    a frequency transform configured to transform the digital data into a frequency spectrum having in-span power and out-of-span power;
    a detector configured to detect an out-of-span power condition by comparing the out-of-span power to an out-of-span power condition parameter; and
    means for notifying the user of the detected out-of-span power condition.

2. A test and measurement instrument as in claim 1 wherein the out-of-span power condition parameter is an absolute power level.

3. A test and measurement instrument as in claim 1 wherein the out-of-span power condition parameter is a total in-span power.

4. A test and measurement instrument as in claim 1 wherein the out-of-span power condition parameter is a largest in-span signal.

5. A test and measurement instrument as in claim 1 wherein the out-of-span power condition parameter is a display value.

6. A test and measurement instrument as in claim 1 wherein the notifying means is configured to notify the user by displaying a message on a time-domain display.

7. A test and measurement instrument as in claim 1 wherein the notifying means is configured to notify the user by displaying a message on a frequency-domain display.

8. A test and measurement instrument as in claim 1 wherein the notifying means is configured to notify the user by producing an audible tone.

9. A test and measurement instrument as in claim 1 wherein the notifying means is configured to notify the user by directing the user to view a full frequency span.

10. A test and measurement instrument as in claim 1 wherein the notifying means is configured to notify the user by displaying a full frequency span for the user.

11. A test and measurement instrument as in claim 1 wherein the notifying means is configured to notify the user by generating an interrupt.

12. A test and measurement instrument as in claim 1 wherein the notifying means is configured to notify the user by returning a measurement result with an indication of an invalid measurement.

13. A test and measurement instrument comprising:
    an analog-to-digital converter configured to digitize an input signal to produce digital data;
    a frequency transform configured to transform the digital data into a frequency spectrum having in-span power and out-of-span power;
    a first analog filter configured to filter the in-span power to determine an in-span amplitude;
    a second analog filter configured to filter the out-of-span power to determine an out-of-span amplitude;
    a detector configured to detect an out-of-span power condition by comparing the in-span amplitude and the out-of-span amplitude; and
    means for notifying the user of the detected out-of-span power condition.

14. A test and measurement instrument as in claim 13 wherein the notifying means is configured to notify the user by displaying a message on a time-domain display.

15. A test and measurement instrument as in claim 13 wherein the notifying means is configured to notify the user by displaying a message on a frequency-domain display.

16. A test and measurement instrument as in claim 13 wherein the notifying means is configured to notify the user by producing an audible tone.

17. A test and measurement instrument as in claim 13 wherein the notifying means is configured to notify the user by directing the user to view a full frequency span.

18. A test and measurement instrument as in claim 13 wherein the notifying means is configured to notify the user by displaying a full frequency span for the user.

19. A test and measurement instrument as in claim 13 wherein the notifying means is configured to notify the user by generating an interrupt.

20. A test and measurement instrument as in claim 13 wherein the notifying means is configured to notify the user by returning a measurement result with an indication of an invalid measurement.

* * * * *